United States Patent [19]

Gesin

[11] Patent Number: 5,118,963
[45] Date of Patent: Jun. 2, 1992

[54] SYMMETRICAL CONTROLLED SWITCHING CIRCUIT

[75] Inventor: Milford M. Gesin, Forreston, Ill.

[73] Assignee: Honeywell Inc., Minneapolis, Minn.

[21] Appl. No.: 445,830

[22] Filed: Nov. 29, 1989

[51] Int. Cl.⁵ .......................................... H03K 17/725
[52] U.S. Cl. .................................. 307/116; 307/44; 307/643; 307/113
[58] Field of Search ...................... 307/11, 18, 19, 23, 307/29, 30, 31, 32, 38–40, 51–53, 43–48, 64–66, 643, 645, 648, 638, 113, 115, 145, 146, 116

[56] References Cited

U.S. PATENT DOCUMENTS

| | | | |
|---|---|---|---|
| 3,976,986 | 8/1976 | Zabroski | 307/66 X |
| 4,129,791 | 12/1978 | Sato | 307/645 |
| 4,384,213 | 5/1983 | Bogel | 307/64 |
| 4,480,197 | 10/1984 | Hollaway | 307/12 X |
| 4,578,591 | 3/1986 | Floyd et al. | 307/10.1 |
| 4,906,858 | 3/1990 | Gesin | 307/11 |

Primary Examiner—A. D. Pellinen
Assistant Examiner—David Osborn
Attorney, Agent, or Firm—Charles L. Rubow

[57] ABSTRACT

A switching circuit is disclosed which provides a plurality of switches which can be caused to open or close, a controller which can selectively draw current from a plurality of power sources connected in electrical communication with the switches and isolating devices connecting the switches to the controller. The controller is connected to a regulator and to one voltage interconnection and the regulator is connected to another voltage interconnection by two conductive paths which control individual switches that are associated with individual power supplying loads.

8 Claims, 2 Drawing Sheets

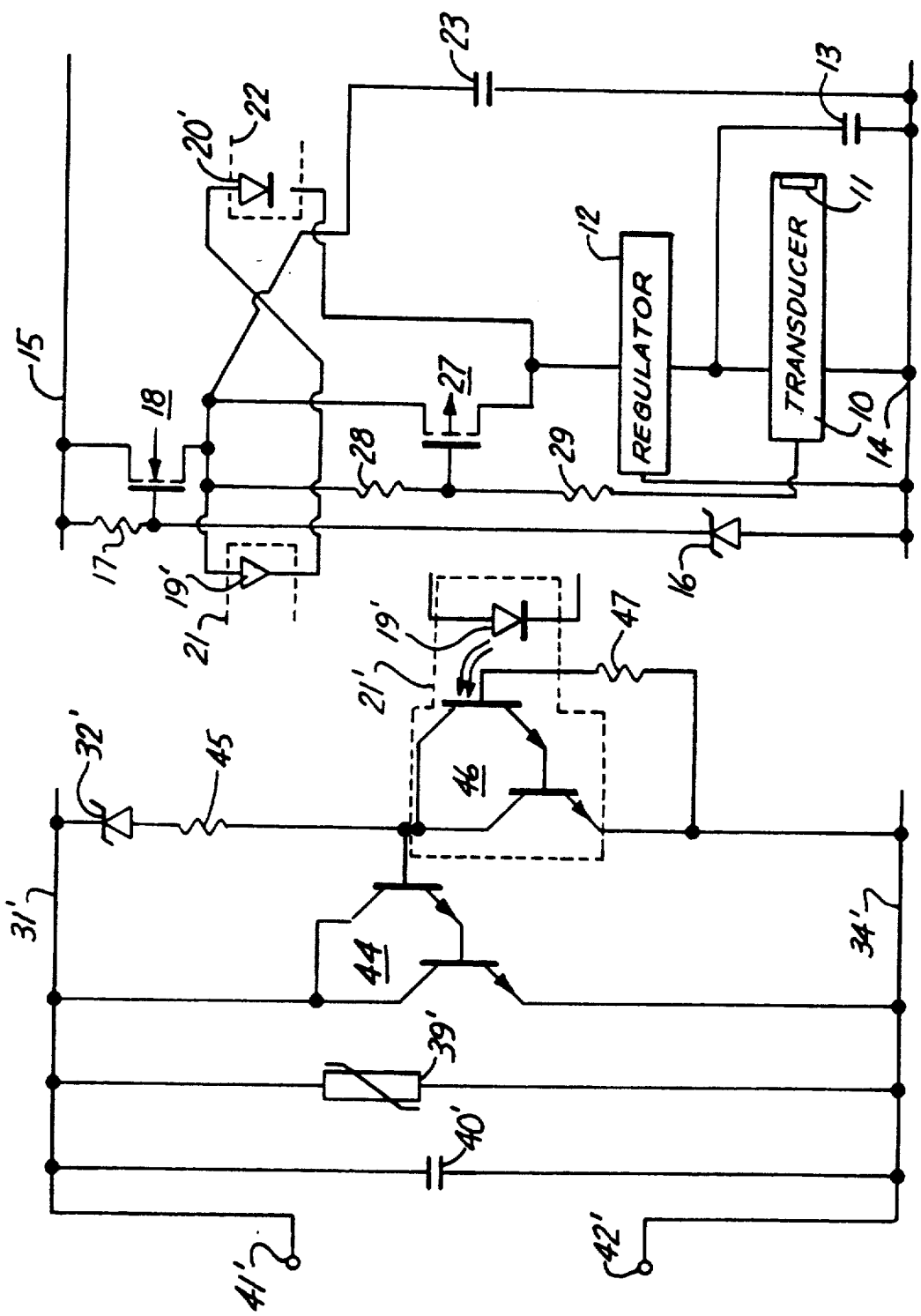

5,118,963

1

SYMMETRICAL CONTROLLED SWITCHING CIRCUIT

REFERENCE TO COPENDING APPLICATION

Reference is hereby made to the copending application by Milford M. Gesin entitled "Controlled Switching Circuit" having Ser. No. 07/209,944, and U.S. Pat. No. 4,906,858 which was filed on June 22, 1988 and issued on March 6, 1990, and which the same assignee as the application. This copending application discloses a controlled switching circuit to be used to some extent for the same purposes but of a differing configuration from that specifically disclosed and claimed in the present application.

BACKGROUND OF THE INVENTION

The present invention relates to commonly controlled multiple electronic switches and, more particularly, to controlled electronic switches in which electrical power for the control arrangement is provided from external load circuits connected to one or more of such switches.

There are many electrical circuit situations in which events in various separate circuits are to be coordinated with one another through there being a more or less simultaneous switching event occurring in each such circuit. If there is not to be actual simultaneous occurrence, at least there is often a requirement that the switching events in one circuit occur approximately simultaneously with those in some of the separate circuits and within a fixed time of switching events occurring in others of those separate circuits.

This desire can be given effect by the use of a set of electrical switches under the control of a common control arrangement. While such functions have often been provided in the past through the use of electrically operated mechanical relay switches, there are currently many situations in which the limitations of such relays are desired to be avoided through the use of electronic switches. Such limitations to be overcome by the use of electronic switches include limits on the speed of switching, limits on the volume of space required for the controlled electronic switches, available power, reliability of operation in adverse environments, etc.

The switching characteristic usually required of such electrical switches is that they either be normally open or normally closed. In a normally open condition or state, the switch provides a relatively low conductivity between its terminals to the point of being an open or nearly open circuit between the switching terminals of the switch involved. In a normally closed state, the switch provides a relatively high electrical conductivity between its terminals to the extent of approaching a short circuit between the switching terminals of the switch involved. A switching command from the switch controller will result in a normally closed switch taking on approximately the characteristic described above for the normally open switch and vice versa. In some situations, a change of state from normally closed to open, or from normally open to closed, is to result in the new state continuing without regard to the subsequent status of the controller commands, and in other situations the new state is to continue until the controller commands otherwise.

Electrical power to operate the control arrangement for the switches in many situations will be available only from one or more of the external load circuits to which the electronic switches are connected rather than being independently available to this control arrangement. If the external power is available to an electronic switch that is normally open, the closing of that switch to become a near short circuit will markedly reduce the voltage available to the controller from the external source as that electronic switch provides a high conductivity path between its terminals. Thus, a controlled electronic switch is needed which can operate with an external load circuit supplying power thereto even though the switch for this external circuit must be closed at times. In addition, a controlled switching circuit should permit other electronic switches under such control to be operated independently of current flow conditions in such an external load circuit supplying power. Further, each of the external load circuits connected to the controlled electronic switch, in so operating, should remain essentially electrically isolated from one another, at least each being prevented from drawing any significant current from any of the others through the switch itself.

SUMMARY OF THE INVENTION

The present invention provides a switching circuit having a plurality of switches each with a control region which can be energized to be caused to open or close, a controller having output devices therein which can selectively draw current from any in the controller to provide an energy output coupled to the control regions of the switches, and isolating devices connecting the switches to the controller. As a result, external load circuits can be connected to the switches to provide electrical energy to the controller while staying essentially isolated from one another and having the operation thereof directed by that controller.

BRIEF DESCRIPTION OF THE DRAWINGS

FIG. 2 shows an alternative circuit schematic and block diagram for a portion of the diagram of FIG. 1, and FIG. 3 shows an alternative circuit schematic diagram for a portion of the diagram of FIG. 1.

DETAILED DESCRIPTION OF THE PREFERRED EMBODIMENTS

Figure 1:
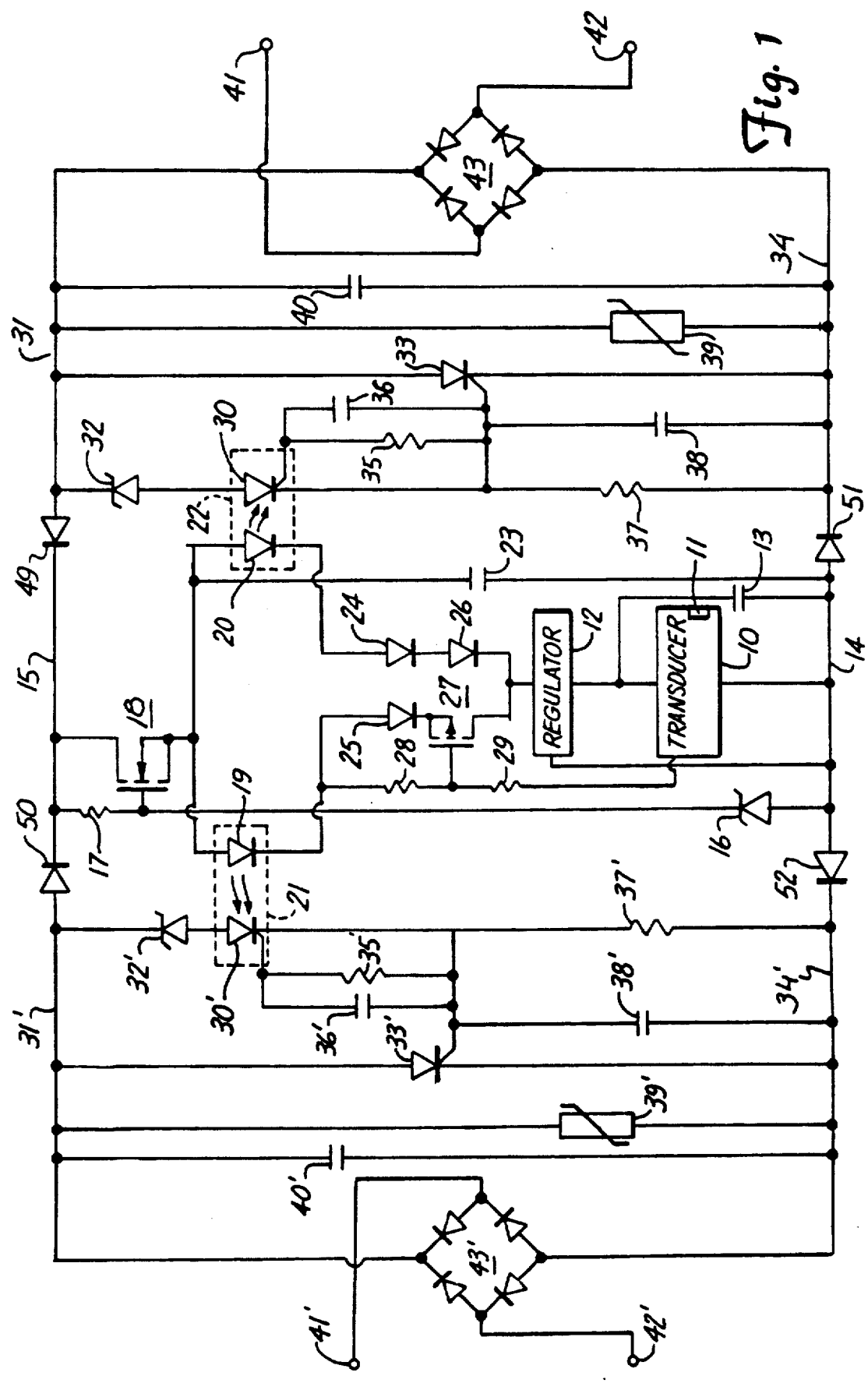
FIG. 1 shows a circuit schematic and block diagram of a system embodying the present invention.

FIG. 1 shows a combined circuit schematic and block diagram of a system embodying the controlled electronic switching circuit of the present invention. In that diagram, a controller, 10 is the source of control signals for operating this switching circuit. A typical choice for the controller is a transducer circuit based on a proximity sensor, and its associated circuitry to sense the occurrence of objects coming within a selected range of sensor 11, and perhaps sensing such an occurrence only if the object is constructed of selected materials, as a basis for causing a selected switching action to take place at the output of transducer 10 to direct operations of the remaining portions of the circuit of FIG. 1. Such a transducer is set out in the above-identified copending application assigned to the same assignee and is incorporated herein by reference. Alternatively, manual control or another kind of sensor, or some other condition-based control, could be substituted for transducer 10.

Electrical power for the operation of transducer 10 is provided by a voltage regulator, 12, which provides at the regulated voltage output thereof a regulated 5.0 V that is supplied to transducer 10. This voltage value controller can be any suitable kind of voltage regulator, a typical choice being an integrated circuit regulator designated LP2951C from National Semiconductor, Inc which is a series-pass kind of regulator. This regulated voltage is further smoothed and maintained, and oscillations prevented therein, by the addition of a capacitor, 13, between a low voltage interconnection, 14, in this control portion of the switch and the junction of transducer 10 and regulator 12. A typical value for capacitor 13 is 10 μf. A connection from regulator 12 to low voltage interconnection 14 is provided as a reference against which regulator 12 supplies its output voltage. Transducer 10 is connected between the regulated voltage output of regulator 12 and low voltage interconnection 14.

The voltage chosen for the output of regulator 12 and the choice of the circuitry for transducer 10 primarily sets the current drain for the control portion of the switching circuit of FIG. 1 whatever the voltage supplied to this circuit portion because of the regulation provided and the primarily series device interconnections therein as will be described below. This current drain is usually desired to be small and fairly constant, particularly during "open switch" operation of any of the output switching circuits being controlled.

The voltage supply for operating regulator 12 is supplied from a high voltage interconnection, 15, in this control portion of the FIG. 1 controlled switch through a further voltage regulator and switching control arrangement that are each provided in series with one another and with regulator 12 and transducer 10. A reference voltage for this second voltage regulator is provided by a Zener diode, 16, connected in series with a resistor, 17, between high voltage interconnection 15 and low voltage interconnection 14. Typical breakdown voltage for Zener diode 16 is 20.0 V, and a typical resistance value for resistor 17 is 2.0 MΩ. The voltage across zener diode 16 sets the voltage for the gate of an n-channel, metal-oxide semiconductor field-effect transistor (MOSFET), 18, having its gate connected to the junction of Zener diode 16 and resistor 17. The drain of transistor 18 is connected to high voltage interconnection 15, and the source of transistor 18 is connected to the junction of the anodes of a pair of light-emitting diodes, 19 and 20, each as part of one of a pair of optical isolation components, 21 and 22, respectively. In addition, the source of MOSFET 18 is also connected to one side of a capacitor, 23, the other side of which is connected to low voltage interconnection 14. The substrate connection of MOSFET 18 is made to its source.

As a result of this circuit topology, the voltage at the anodes of diodes 19 and 20, and across capacitor 23, is equal to the breakdown voltage of Zener diode 16 less the threshold voltage of MOSFET 18, even though the voltage on high voltage interconnection 15 may rise to many hundreds of volts as will be described below. Of course, the drain breakdown voltage of MOSFET 18 must be high enough to withstand such voltages on high voltage interconnection 15 without breaking down if the circuit of FIG. is to operate properly. Optical isolation components 21 and 22 must withstand the maximum external load circuit voltage differences without breakdown for proper operation of the controlled switch circuit.

The voltage to operate regulator 12 is supplied from the cathodes of light-emitting diodes 19 and 20 through two circuits paths provided therefrom to the voltage input of that regulator. The cathode of light-emitting diode 20 is connected to the anode of another light-emitting diode, 24, and the cathode of light-emitting diode 19 is also connected to the anode of another light-emitting diode, 25. Light-emitting diodes 24 and 25 are used as indicators for showing whether the corresponding output switching circuit portions are in the closed switch condition, as will be further described below. Thus, though present in the circuit of FIG. 1, light-emitting diodes 24 and 25 are not necessary for its proper operation and could be replaced by a short circuit connection if such indications are not desired.

The cathode of light-emitting diode 24 is in turn connected to the anode of a further diode, 26, the cathode of which is connected to the voltage input of regulator 12. Diode 26 is an ordinary pn junction diode. The cathode of light-emitting diode 25 is connected to the source of a p-channel MOSFET, 27, the drain of which is also connected to the input of regulator 12 and so to the cathode of diode 26.

MOSFET 27 is controlled at its gate by the output switching action of transducer 10 mentioned above. The output of transducer 10 is connected by a pair of resistors, 28 and 29, connected in series with one another to both the cathode of light-emitting diode 19 and the anode of light-emitting diode 25. The junction of resistors 28 and 29 is connected to the gate of MOSFET 27. Typically, the resistance value of resistor 28 is 2.0 MΩ and that of resistor 29 is 0.5 MΩ.

Thus, if the output of transducer 10 is left in an open, or high impedance, state so that little or no current is drawn through resistors 28 and 29, MOSFET 27 will be in the "off" condition. Alternatively, transducer 10 can set its output at approximately the potential on low voltage interconnection 14 through a relatively low impedance being provided between them because, for example, of the sensing by sensor 11 of some external effect. There will then be a resulting current drawn through resistors 28 and 29 leading to the switching of MOSFET 27 into the "on" condition.

In operation, assuming a sufficient voltage is present at the source of MOSFET 18, transducer 10 will usually have its output initially in an open state in the absence of some specified condition being met by the control circuitry, such as an effect being sensed by sensor 11, or by having been switched to that state in the situation of manual controls. As a result, MOSFET 27 will be in the "off" condition. However, there is nothing to prevent current being drawn through light-emitting diode 20, light-emitting diode 24 and diode 26 by the voltage input of regulator 12 to therefrom provide an output voltage to operate transducer 10. This being so, light will emanate from light-emitting diode 20 to impinge on a photo-SCR (silicon controlled rectifier), 30, which will initiate conduction therethrough if a sufficient voltage has been applied thereacross.

The circuit in which photo-SCR 30, as part of optical isolation component 22, is present is the right-hand one of two output switching circuits in the controlled switch shown in FIG. 1. A description of these output switching circuits will be given below. Because of the constantly provided electromagnetic radiation transferring energy from light-emitting diode 20 to photo-SCR 30, this output switch will typically behave essentially as a normally closed switch.

No significant current will flow through light-emitting diode 19 because of MOSFET 27 being in the "off"

condition, and because of the high impedances of resistors 28 and 29, and the open state of the output circuit of transducer 10. As a result, the left-hand output switching circuit of the controlled switch of FIG. 1 coupled to the control arrangement thereof through optical isolation component 21 will not have electromagnetic radiation energy delivered thereto for initiating operations therein, and so will essentially behave as a normally open switch, again as will be described below.

Of course, several alternative arrangements are possible for placing light-emitting diodes in series with regulator 12 where such diodes are also coupled to output circuits. In one alternative, further light-emitting diodes with series resistors can be connected in parallel between the voltage input of regulator 12 and the source of MOSFET 18, which are also coupled to further output switching circuits, to thereby increase the number of circuits under control of the control arrangement described above. Alternatively, further circuit branches having light-emitting diodes and a corresponding MOSFET in series can be connected in parallel between the voltage input of regulator 12 and the source of MOSFET 18, with the diodes also being coupled to further output switching circuits, to thereby increase the number of circuits under control of other sensors or other manual controls. The switching of one of these MOSFET's though will cause current to be shunted away from branches operating normally closed output switching circuits so that they will open, and there may not be sufficient current in other MOSFET controlled branches that are then switched on to operate the associated output switching circuits in the absence of further measures.

Another alternative control arrangement circuit shown in FIG. 2 is one way to arrange for all of the output switching circuits to be parallel acting, normally closed switches by placing the two light-emitting diodes 19 and 20, redesignated 19' and 20' there, in series with one another but leaving them coupled to their output switching circuits as they were previously. Component designations used in FIG. I have been retained in FIG. 2 for the same components except for light-emitting diodes 19 and 20 which have been redesignated 19' and 20' as indicated above. The indicator light-emitting diodes of FIG. 1 have been removed in the circuit of FIG. 2.

The circuit of FIG. 2 operates much as that of FIG. 1. Current is continually drawn jointly through both of light-emitting diodes 19' and 20' by regulator 12 so long as MOSFET 27 is in the "off" condition. The output switching circuits to which these diodes are coupled will, as a result, behave as normally closed switches. Transducer 10, in switching its output to a low impedance state, causes current to be drawn through resistors 28 and 29 to switch MOSFET 27 into the "on" condition. This permits current to be drawn through MOSFET 27 which is shunted away from both of light-emitting diodes 19' and 20' leaving the output circuits to which they are coupled behaving as normally open switches. Thus, transducer 10 controls both output switching circuits leaving them as closed switches until such current is drawn at its output.

The output switching circuits of the controlled switch of FIG. 1 are shown identical with one another, though they need not be, and so will be described with common component designations in each except for adding a prime to the numerical designations shown in the left-hand circuit. Hence, the photo-SCR of the left-hand output switching circuit in optical isolation component 21 which receives electromagnetic radiation energy from light-emitting diode 19 will be designated 30' in FIG. 1 in contrast to photo-SCR 30 in the right-hand circuit. The anodes of photo-SCR's 30 and 30' are connected to high voltage interconnections, 31 and 31', of the right- and left-hand output switching circuits, respectively, typical breakdown voltage value for Zener diodes 32 and 32' is 20.0 V. The purpose of these Zener diodes will be described below.

The cathodes of photo-SCR's 30 and 30' are connected to the gates of the main load control SCR in each circuit. The cathode of photo-SCR 30 is connected to the gate of a load control SCR, 33, and the cathode of photo-SCR 30' is connected to the gate of a load control SCR, 33'. The anode of load control SCR 33 is connected to high voltage switching circuit interconnection 31, and the anode of load control SCR 33' is connected to high voltage switching circuit interconnection 31'. The cathode of load control SCR 33 is connected to a right-hand output switching circuit low voltage interconnection, 34, and the cathode of load control SCR 33' is connected to a left-hand output switching circuit low voltage interconnection, 34'.

The gates of photo-SCR's 30 and 30' each have noise protection and gate leakage current sinking circuits. Photo-SCR 30 has a resistor, 35, and a capacitor, 36, connected between its gate and the gate of load control SCR 33. Similarly, photo-SCR 30' has a resistor, 35', and a capacitor, 36', connected between its gate and the gate of load control SCR 33'. Load control SCR 33 has a resistor, 37, and a capacitor, 38, connected between it and output switching circuit low voltage interconnection 34. Load control SCR 33' has a resistor, 37', and a capacitor, 38', connected between it and output switching circuit low voltage interconnection 34'.

Resistors 35 and 35' have a typical value of 100 k$\Omega$, and resistors 37 and 37' have a typical resistance of 100 $\Omega$. Capacitors 36 and 36' have a typical capacitance of 0.001 $\mu$f, and capacitors 38 and 38' have a typical capacitance of 0.01 $\mu$f.

A varistor, 39, is connected between output switching circuit high voltage interconnection 31 and low voltage interconnection 34, as is a capacitor, 40. A varistor, 39', is connected between output switching circuit high voltage interconnection 31' and low voltage interconnection 34', as is a capacitor, 40'. These components are used to provide protection against voltage transients of the controlled switch of FIG. 1, and do not normally pass steady currents therethrough. Capacitors 40 and 40' typically have capacitance values of 0.001 $\mu$f.

No direct power supply connection is shown to the control arrangement circuit of FIG. as the electrical energy for operating this circuit is to be obtained from one or more external load circuits connected to corresponding ones of the output switching circuits in this controlled switching circuit of FIG. 1. Such an external load circuit (not shown) would be connected to either the right-hand output switching circuit pair of switching terminals, 41 and 42, or to the other output switching circuit pair of switching terminals shown, 41' and 42'.

Switching terminals 41 and 42 are in turn connected to corresponding opposite connection points on a diode bridge, 43, and switching terminals 41' and 42' are connected to corresponding opposite connection points on another diode bridge, 43'. The other two connection points opposite one another on diode bridge 43 are connected to right-hand output switching circuit high voltage interconnection 31 and low voltage interconnection 34, respectively. Similarly, the other two connection points opposite one another on diode bridge 43' are connected to left-hand output switching circuit high voltage interconnection 31' and low voltage interconnection 34'.

Interconnections 31 and 34 are the primary switching terminals for the output switching circuit on the right in FIG. 1, and they are adapted to be connected to an external load circuit containing a source of electrical energy at terminals 41 and 42 through diode bridge 43. Similarly, interconnections 31 and 34' are the primary switching connections for the output switch on the left in FIG. 1, and they are adapted to be connected to an external load circuit containing a source of electrical energy at terminals 41' and 42' through diode bridge 43'.

The source of electrical power in an external load circuit connected to either terminals 41 or 42, or to terminals 41' or 42', may be either a constant polarity source of electrical power or an alternating polarity source of power since, in either case, the diode bridges 43 and 43' will provide a resulting positive voltage on the corresponding output switching circuit high voltage interconnection with respect to the output switching circuit voltage low voltage interconnection. If the electrical power source in the external load circuit is an alternating polarity source, the voltage on the corresponding output switching circuit high voltage interconnection will be a pulsing positive voltage with respect to the associated low voltage interconnection.

On the other hand, a constant polarity substantially constant value voltage source in such an external load circuit will lead to a fairly steady voltage appearing on the corresponding output switching circuit high voltage interconnection which will also be positive with respect to the associated low voltage interconnection. However, a constant polarity, substantially constant value voltage source in the external load circuit will be switched on indefinitely by having the output switching circuit becoming a closed switch as there will be no way to switch off load control SCR's 33 or 33' once they have been switched into the conducting state since the voltage thereacross will never approach zero in those circumstances. A periodic alternating polarity source, of course, will switch these load control SCR's off in each half cycle.

FIG. 3 shows an alternative output switching circuit for the left-hand output switching circuit of FIG. 1 which can control constant polarity, substantially constant voltage based on using a photo-Darlington transistor arrangement, and can also control half cycles of alternating polarity voltages. Again, the same designations are used in FIG. 3 as were used in FIG. 1 for similar components used there. A load control Darlington transistor arrangement, 44, has its collector connected to output switching circuit high voltage interconnection 31, and its emitter connected to output switching circuit low voltage interconnection 34'. The base of Darlington transistor arrangement 44 is connected through a resistor, 45, and Zener diode 32+ to output switching circuit high voltage interconnection 31'.

The base of Darlington transistor arrangement 44 is also connected to the collector of a photo-Darlington transistor arrangement, 46, serving as part of an optical isolation component, 21', in which is provided a light-emitting diode, 19', as before. The emitter of photo-Darlington transistor arrangement 46 is connected to output switching circuit low voltage interconnection 34'. The base of photo-Darlington transistor arrangement 46 is connected through a resistor, 47, to the emitter of that arrangement. Because the initiation and cessation of current through light-emitting diode 19' will cause the output switching circuit of FIG. 3 to go from a closed switch to a open switch position, or vice verse, the control of current through light-emitting diode 19' by the remaining portions of the control arrangement can cause the output switching circuit of FIG. 3 to behave as a controlled switch with respect to an external load circuit connected to output terminals 41' and 42' rather than being stuck in the closed switch mode.

If, in the circuit of FIG. 1, there is a periodic alternating polarity voltage source connected in series with a significant load and which together are connected across terminals 41 and 42, there will be a pulsating positive voltage provided from diode bridge 43 between terminals 31 and 34 which will peak in voltage and return to zero volts every half cycle of the alternating polarity source. However, current will not flow in significant quantity between output switching circuit high voltage interconnection 31 and output switching circuit low voltage interconnection 34 immediately in each cycle even though light-emitting diode 20 is continually providing electromagnetic radiation energy to photo-SCR 30. This is because of the provision of Zener diode 32 in series with photo-SCR 30. Since the breakdown voltage of Zener diode 32 is on the order of 20.0 V, that voltage level must be reached before photo-SCR 30 will break down to permit significant current flow therethrough to switch load control SCR 33 on to thereby permit maximum current to flow through the output switching circuit on the right in the controlled switch arrangement of FIG. 1.

Thus, the presence of Zener diode 32 requires that the voltage differential between the right-hand output switching circuit high and low voltage interconnections 31 and 34 reach 20 V in every half cycle. This arrangement assures that at least a voltage of around that magnitude will be provided between high voltage interconnection 15 and low voltage interconnection 14 of the control arrangement for the controlled switch shown in FIG. 1. Zener diodes 32' for the left-hand output switching circuit of FIG. in FIG. 3 assure the same result that occurs between the left-hand output switching circuit high and low voltage interconnections for external load circuits connected to them.

The voltage regulator formed by Zener diode 16, resistor 17 and MOSFET 18 of this control arrangement provide a means of charging capacitor 23 from this voltage occurring between interconnections 15 and 14 provided from an external load circuit alternating polarity source through an output switching circuit. Capacitor 23, typically having a capacitance of 22 μf, thus stores a significant charge for operating regulator 12 and transducer 10 in the control arrangement portion of FIG. 1 during those times in each half cycle when the voltage of the alternating polarity source in the external load circuit connected to terminals 41 and 42 is relatively near zero volts.

Such voltages occurring between control arrangement high voltage interconnection 15 and low voltage interconnection 14, supplied from a voltage source in the external load circuit connected to terminals 41 and 42 through the right-hand output switching circuit of FIG. 1, are coupled through a diode, 49. Diode 49 has its anode connected to right-hand output switching circuit high voltage interconnection 31 and its cathode connected to control arrangement high voltage interconnection 15. Voltage so supplied between interconnections 15 and 14 is prevented from having an effect on the left-hand output switching circuit of FIG. 1 by a further diode, 50, having its anode connected to left-hand output switching circuit high voltage interconnection 31' and its cathode connected to control arrangement high voltage interconnection 15. Diodes 49 and 50 must be able to withstand the maximum voltage differences encountered between the right- and left-hand output switching circuits in FIG. 1 in reverse bias situations if each output switching circuit is to operate independently of the current flow conditions in the other.

These last statements concerning diodes 49 and 50 assume that there is no voltage source in the external load circuit connected to terminals 41' and 42' of the left-hand output switching circuit shown in FIG. 1. If there is also such an external load circuit connected to those terminals, then the respective values of the voltage sources therein at any given time determines which one, if either, is then supplying a voltage between high voltage interconnection 15 and low voltage interconnection 14 of the control arrangement. If the switching on of load control SCR 33 or load control SCR 33' in the right-hand and left-hand output switching circuits, respectively, is keeping the voltage therefrom below the breakdown voltage value of Zener diodes 32 and 32', and the other is at a low voltage point in its cycle, neither external load circuit will be supplying a voltage to the control arrangement portion of FIG. 1. As a result, that control arrangement portion will be operating on the charge stored in capacitor 23 until the voltage rises sufficiently in one of the output circuits to recharge that capacitor and supply the operating voltage therefor.

The left-hand output switching circuit in the controlled switch of FIG. 1 will not switch on until directed to do so by a signal from transducer 10 causing MOSFET 27 to switch into the "on" condition and draw a current through light-emitting diode 19. Once that occurs, the left-hand output switching circuit in FIG. 1 will operate in the same manner as the right-hand output switching circuit had been operating. The right-hand output switching circuit will, however, be switched to an open switch in these circumstances since the drop across MOSFET 27 will be much less than that across diode 26 so that the current supplied by MOSFET 18 will be shunted through MOSFET 27.

Two further diodes are supplied in FIG. 1, each located between the control arrangement portion and the right-hand and left-hand output switching circuits of the controlled switch of that figure just as are diodes 49 and 50. One of these diodes, 51, has its anode connected to control arrangement low voltage interconnection 14 and its cathode connected to right-hand output switching circuit low voltage interconnection 34. The other diode, 52, has its anode connected to control arrangement low voltage interconnection 14 and its cathode connected to left-hand output switching circuit low voltage interconnection 34'. Diodes 51 and 52 are used to prevent current flows from occurring between the left-hand and right-hand output switching circuits during operation which might arise because of the way the external load circuits are connected thereto, or because of the phasing differences in the voltage source provided in those external load circuits.

Thus, the two output switching circuits of FIG. 1, in opposite switch states, can be switched at will between them by the control arrangement portion of the controlled switch of FIG. 1 independently of the current flow conditions in either. Of course, the relationship of the switching states of various output circuits used with the control portion of this controlled switch can be altered from the one occurring in this switch by making other choices for the switching control arrangement circuitry connected between the source of MOSFET 18 in the second voltage regulator and the voltage input of regulator 12. Further, the output switching circuits are prevented from electrically interacting between each other sufficiently to each be essentially unaffected by the current flow conditions occurring in other output switching circuits under control of that control arrangement.

Although the present invention has been described with reference to preferred embodiments, workers skilled in the art will recognize that changes may be made in form and detail without departing from the spirit and scope of the invention.

What is claimed is:

1. A switching circuit for controlling a plurality of external load circuits, comprising:
    a first voltage interconnection;
    a second voltage interconnection, a first portion of each of said first and second interconnections being connectable to a first load and a first power supply, a second portion of each of said first and second voltage interconnections being connectable to a second load and a second power supply;
    a regulator connected between said first voltage interconnection and said second voltage interconnection between said first and second portions of said first and second voltage interconnections, said regulator being connected by first and second parallel conductive paths to said first voltage interconnection, said first conductive path comprising a semiconductive switch, said second conductive path comprising a means for providing a voltage differential between said first voltage interconnection and said regulator;
    a transducer connected between said regulator and said second voltage interconnection, said transducer having an output which is switchable between first and second conditions in response to a stimulus, said output being connected to said semiconductive switch to cause said semiconductive switch to assume a conductive state in response to said first condition and to assume a nonconductive state in response to said second condition;
    a first switching device connected between said first and second voltage interconnections at both said first portions and operatively coupled to said first conductive path to connect said first and second voltage interconnections in electrical communication with each other in response to electrical current passing through said first conductive path; and
    a second switching device connected between said first and second voltage interconnections at said second portion and operatively coupled to said second conductive path to connect said first and second voltage interconnections in electrical communications with each other in response to electrical current passing through said second path.

2. The circuit of claim 1, further comprising:
a first light emitting diode connected in series with said semiconductor switch in said first conductive path and a second light emitting diode connected in series with said voltage differential providing means in said second conductive path.

3. The circuit of claim 1, further comprising:
means for preventing electrical communication between said first and second switching devices.

4. The circuit of claim 1, wherein:
said voltage differential providing means is a diode.

5. The circuit of claim 1, wherein:
said first switching device is operatively coupled to said first conductive path by an optical isolation component.

6. The circuit of claim 1, wherein:
said semiconductive switch is a MOSFET.

7. The circuit of claim 1, further comprising:
means for preventing electrical communication between said first and second portions of said first and second voltage interconnections.

8. The circuit of claim 7, wherein:
said preventing means comprises a first pair of diodes connected to said first voltage interconnection and a second pair of diodes connected to said second voltage interconnection, said first and second pairs of diodes each comprising diodes arranged in opposite polarity relation with each other, said first and second conductive paths being connected in electrical communication with a point between said first pair of diodes.

* * * * *